United States Patent
Washida

[19]

[11] Patent Number: 6,144,091
[45] Date of Patent: Nov. 7, 2000

[54] SEMICONDUCTOR DEVICE

[75] Inventor: Tetsuro Washida, Tokyo, Japan

[73] Assignee: Mitsubishi Denki Kabushiki Kaisha, Tokyo, Japan

[21] Appl. No.: 09/144,643

[22] Filed: Aug. 31, 1998

[30] Foreign Application Priority Data

Apr. 13, 1998 [JP] Japan .................................. 10-101131

[51] Int. Cl.[7] .................................................. H01L 23/48
[52] U.S. Cl. ........................ 257/693; 257/737; 257/738; 257/778; 257/780; 257/786; 257/777; 257/773; 257/690; 257/691; 257/692; 257/697; 257/730
[58] Field of Search ................................. 257/737, 738, 257/778, 780, 786, 777, 773, 690–693, 697, 730

[56] References Cited

U.S. PATENT DOCUMENTS 5,834,844 11/1998 Akagawa et al. ...................... 257/734
5,859,474 1/1999 Dordi ...................................... 257/737
5,909,055 6/1999 Yamashita et al. ..................... 257/693

FOREIGN PATENT DOCUMENTS 2-168662 6/1990 Japan .
8-078573 3/1996 Japan .

*Primary Examiner*—Mahshid Saadat
*Assistant Examiner*—Matthew Warren
*Attorney, Agent, or Firm*—McDermott, Will & Emery

[57] ABSTRACT

A semiconductor device comprising a plurality of bump electrodes wherein signal pins requiring electrical connection are assigned in sequence from the bump electrodes at the outermost periphery near the edge of the semiconductor device to the bump electrodes in an interior area of the semiconductor device, and no-connection pins requiring no electrical connection are assigned to the remaining bump electrodes, is provided. Circuit board cost is thus reduced, and the ease of mounting the semiconductor device to the circuit board is improved.

7 Claims, 5 Drawing Sheets

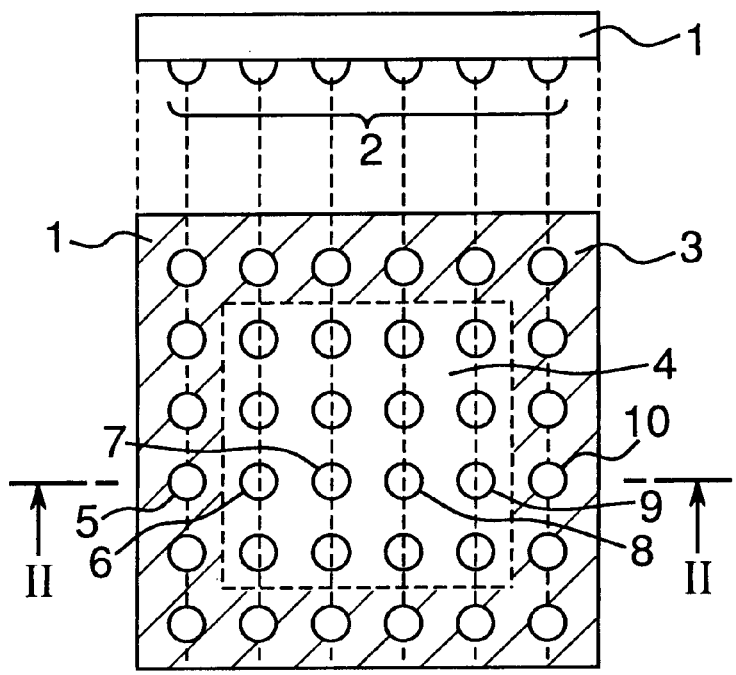
Fig.1A
Fig.1B
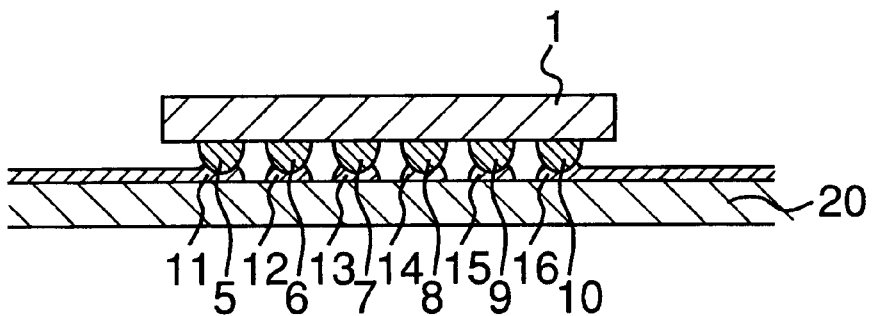
Fig.2

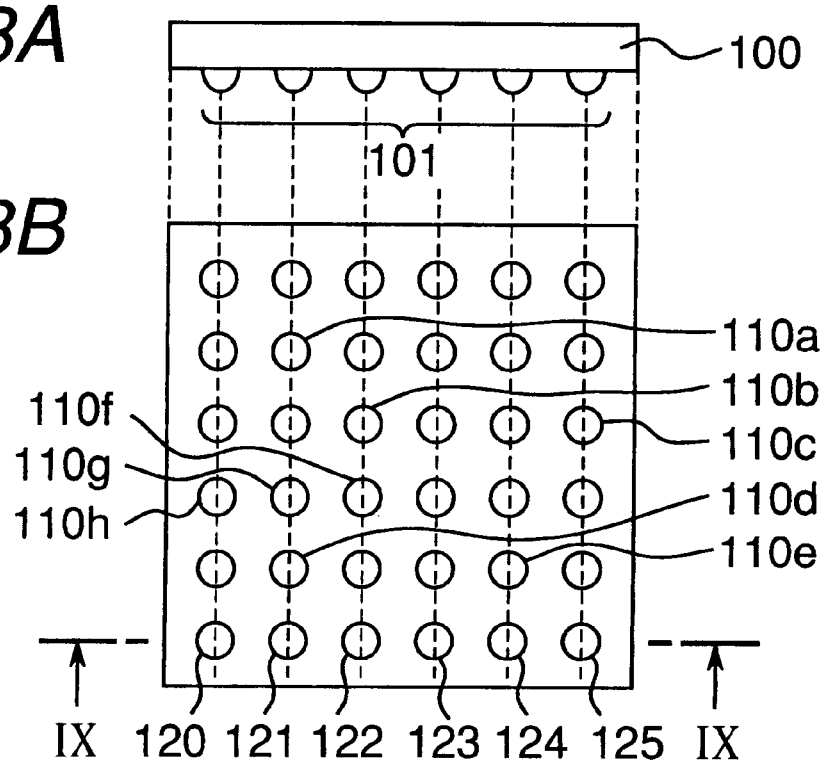
Fig.8A
Fig.8B
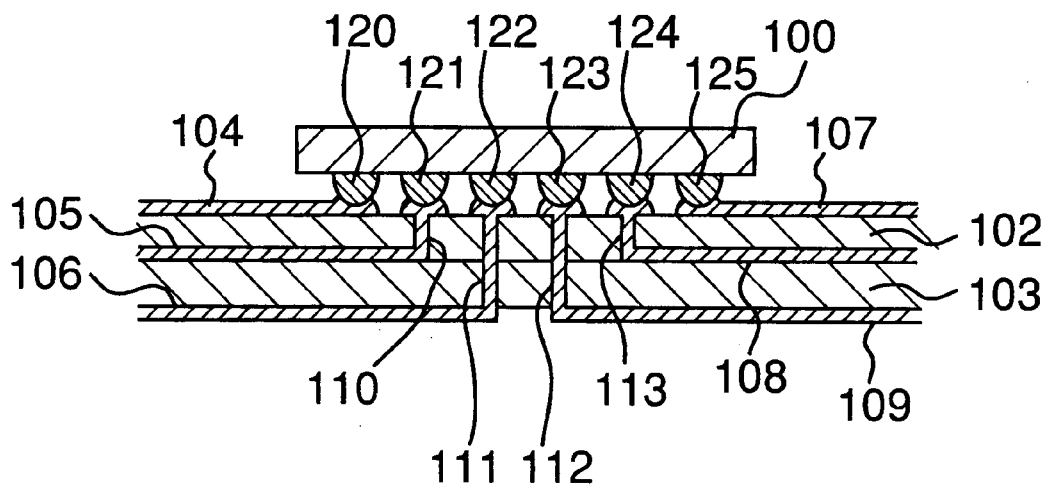
Fig.9

SEMICONDUCTOR DEVICE

BACKGROUND OF THE INVENTION

1. Field of the Invention

The present invention relates to a surface-mount semiconductor device, and more specifically relates to a semiconductor device such as, for example, a CSP (Chip Size Package) or a BGA (Ball Grid Array), of a kind having a plurality of bump electrodes.

2. Description of the Related Art

A conventional semiconductor device 100 comprising a plurality of bump electrodes 101 is shown in a side view in FIG. 8A and in a bottom plan view in FIG. 8B (the bottom being on the side on which the bump electrodes 101 can be seen). As shown in these figures, the bump electrodes 101 are typically arrayed in a matrix pattern. The actual number of bump electrodes varies according to the electrical functions and characteristics of the IC chip of which they are part, but commonly ranges from approximately ten to as many as several hundred.

The electrode contacts of an IC chip sealed in a semiconductor device are connected to proximally positioned bump electrodes according to the bump electrode arrangement. Not all of the bump electrodes are used for supplying power to the IC chip or for exchanging signals and data. As a result, the bump electrodes include both signal pins, which are electrically connected to one of the chip layers, and pins that are not used by the IC chip and to which, therefore, no connection is necessary (referred to as NC or "no connection" pins below). The signal pins and NC pins are also randomly arranged, that is, the signal pins and NC pins are not necessarily grouped in one or more clusters of like pins.

The minimum pitch between bump electrodes in a typical matrix pattern is usually about 0.5 mm, and the minimum diameter of the bump electrodes is approximately 0.2 to 0.3 mm. The smallest width and pitch of the lines that can be provided on a circuit board is therefore approximately 0.2 mm. It is therefore only possible to pass one line between bump electrodes, and NC pins 110a to 110h are randomly dispersed as shown in FIG. 8B according to the arrangement of the electrode contacts of the IC chip.

When the NC pins are arranged around the periphery of the semiconductor device using a different method as described in Japanese Laid-open Patent Publication H6-216271, it is extremely difficult to design a line pattern for connections to a plurality of signal pin bump electrodes positioned inside of this peripheral group of NC pins on a single layer circuit board. Multilayered circuit boards, through-hole wiring, and other design techniques have therefore been used to facilitate wiring to a plurality of bump electrodes in such an inside group.

FIG. 9 is a section view through line IX–IX' in FIG. 8B showing the above-described semiconductor device 100 mounted to a two-layer circuit board comprising layers 102 and 103. As shown in the figure, bump electrodes 120 and 125 at the outside corners of the semiconductor device 100 are connected to lines 104 and 107 on the surface of the first layer 102. Bump electrodes 121 and 124 in the first row inside the outside bump electrodes 120 and 125 are connected through vias 110 and 113 to lines 105 and 108 on the top surface of the second layer 103 as seen in FIG. 9. The inner-most bump electrodes 122 and 123 are then connected to lines 106 and 109 on the back (bottom) of the second layer 103 by way of through-vias 111 and 112.

While this design method enables bump electrode connection as described above, design methods using multiple layers 102 and 103 and vias require more design time than methods using single-layer circuit boards, and result in a more complex structure and higher cost.

Therefore, to simplify the structure, design, and reduce the cost of circuit boards used with semiconductor devices having bump electrodes, there is a need for a semiconductor device having bump electrodes whereby mounting to a circuit board is easier.

SUMMARY OF THE INVENTION

The object of the present invention is thus to provide a semiconductor device having bump electrodes designed to facilitate circuit board mounting, and to simplify circuit board structure and design to thereby reduce the cost.

To achieve the above object, a semiconductor device comprising a plurality of bump electrodes according to one version of the present invention uses the bump electrodes on the outside part of the bump electrode array as signal pins electrically connected to a circuit board to which the semiconductor device is mounted, and uses the bump electrodes on the inside part of the bump electrode array as no-connection pins. By thus arranging the bump electrodes, wiring to bump electrodes located inside of the outermost electrodes can be reduced, thereby simplifying the structure and design of the circuit board on which the semiconductor device is mounted, and accordingly reducing circuit board cost.

The bump electrodes used as signal pins are also preferably arranged in a staggered or zigzag pattern, thereby enabling bump electrodes at the outside of the semiconductor device and bump electrodes one row inside of this outside row to be connected to the circuit board by means of simple, straight lines. Circuit board design is thus further simplified.

It is further possible to use a plurality of adjacent bump electrodes at the outside area of the bump electrode array for the same signal pin. In addition to simplifying circuit board structure and design and reducing circuit board cost, assignment of plural bump electrodes to a signal pin improves the signal pin connection strength. In addition, when one of such a group of bump electrodes becomes separated as a result, for example, of circuit board flexure, a positive connection to the circuit board can be maintained by the remaining bump electrodes in said set.

The present invention further relates to an improved circuit board for use with a semiconductor device according to the present invention. More specifically, an improved circuit board according to the present invention is used for mounting thereto a semiconductor device whereof bump electrodes on the outside part of the bump electrode array are used as signal pins, bump electrodes on the inside part of the bump electrode array are used as no-connection pins, and the circuit board comprises lines to the signal pin bump electrodes of the mounted semiconductor device.

By thus mounting a semiconductor device whereof bump electrodes on the outside part of the bump electrode array are used as signal pins, and bump electrodes on the inside part of the bump electrode array are used as no-connection pins, the semiconductor device can be mounted reliably to a circuit board having a simple line pattern. The structure of the circuit board to which the semiconductor device is mounted can thus be simplified, and circuit board cost can be reduced.

A circuit board according to the present invention further preferably comprises a single connecting member to which all bump electrodes of the semiconductor device used as no-connection pins are connected as a means of improving the mounting strength of the semiconductor device to the circuit board.

BRIEF DESCRIPTION OF THE DRAWINGS

Other objects and attainments together with a fuller understanding of the invention will become apparent and appreciated by referring to the following description and claims taken in conjunction with the accompanying drawings, in which like parts are designated by like reference numerals and in which:

FIG. 1A is a typical side view showing the configuration of a semiconductor device according to a first embodiment of the present invention;

FIG. 1B is a typical plan view of the bottom of the semiconductor device shown in FIG. 1A;

FIG. 2 is a typical side section view showing a semiconductor device according to a second embodiment of the present invention when mounted to a circuit board;

FIGS. 8A and 8B are typical side and bottom plan view of a semiconductor device according to the prior art; and FIG. 9 is a section view of a conventional semiconductor device when mounted to a circuit board.

DESCRIPTION OF THE PREFERRED EMBODIMENTS

Figure 3:
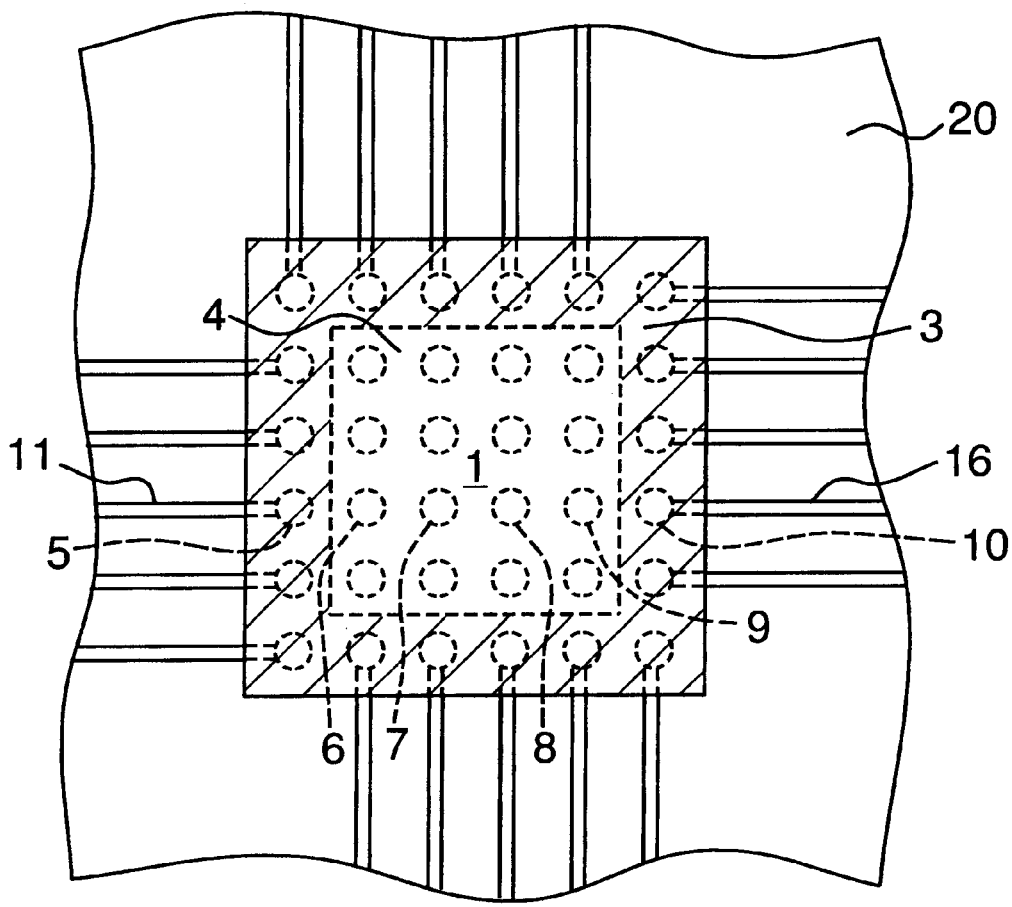
FIG. 3 is a typical side section view showing a semiconductor device according to a first embodiment of the present invention when mounted to a circuit board.

A semiconductor device according to the present invention comprises a plurality of bump electrodes on the bottom surface thereof. Of these bump electrodes, those in a peripheral area are used as the pins (referred to as "signal pins" below) for electrical connection to the circuit board on which the semiconductor device is mounted, and are therefore used for supplying power to an IC chip internal to the semiconductor device, and for exchanging data and signals. Those bump electrodes in an interior area are used as no-connection (NC) pins that are not used by the IC chip and therefore do not require connection to the circuit board. It is therefore possible to reduce the number of signal pins assigned to the bump electrodes in the interior area, and the line pattern on the circuit board can therefore be simplified.

Versions of a semiconductor device thus comprised according to the present invention are described below with reference to the accompanying figures.

Embodiment 1

The smallest pitch between bump electrodes in a common matrix pattern is approximately 0.5 mm, and the smallest bump electrode diameter is approximately 0.2 to 0.3 mm. The smallest width and pitch of lines on a circuit board is also approximately 0.2 mm. These dimensions impose severe constraints on the circuit board wiring pattern, and allow only one line to pass between bump electrodes. These constraints are a particular problem with single-layer circuit boards when there is a plurality of signal pin bump electrodes in the inside part of the bump electrode matrix because it is often not possible to design a wiring pattern with connections to all such interior signal pins.

The line width of an IC chip internal to the semiconductor device, however, is approximately 0.25 mm, that is, approximately 1/1000 of the line width on the circuit board. As a result, there is little change in chip size caused by changing the arrangement of the electrode contacts, and there is a high degree of freedom in chip design.

Therefore, a semiconductor device 1 according to a first embodiment of the present invention uses an IC chip in which the arrangement of the electrode contacts is adjusted such that signal pins are assigned to bump electrodes in a peripheral area of the bump electrode matrix, and NC pins are assigned to bump electrodes in an interior area of the matrix. It should be noted that the semiconductor devices 30 and 50 described below according to second and third embodiments of the invention are likewise comprised.

A semiconductor device 1 according to this first embodiment of the invention is shown in a side view in FIG. 1A and in a bottom plan view in FIG. 1B. As shown in the figure, the semiconductor device 1 is substantially square, and has sealed therein an IC chip (not shown) wherein the electrode contacts are arranged as described above and connected to a 6×6 matrix of bump electrodes 2.

As shown in FIG. 1B, the semiconductor device 1 comprises a signal pin region 3, indicated by the shaded area, around the periphery of the semiconductor device 1, and an NC pin region 4 inside of the signal pin region 3 and indicated by the dotted line in the figure. Bump electrodes in the signal pin region 3 are used as signal pins, and bump electrodes in the NC pin region 4 are used as NC pins.

The size of the signal pin region 3 will vary according to the actual number of signal pins. For example, if the number of signal pins is less than the number of bump electrodes in the outside row, the width of the signal pin region 3 is reduced and signal pins are assigned to only part of this outside row of bump electrodes. On the other hand, if the number of signal pins exceeds the number of outside row bump electrodes, the area of the signal pin region 3 is increased, and signal pins are also assigned to bump electrodes inside of this outside row.

FIG. 2 is a sectional view through line II—II in FIG. 1B showing the semiconductor device 1 mounted to a single-layer circuit board 20. As will be known from the figure, lines 11 and 16 are provided for connections to signal pin bump electrodes 5 and 10 only. NC pin bump electrodes 6, 7, 8, and 9 are simply soldered to the circuit board 20.

FIG. 3 is a top plan view of the semiconductor device 1 mounted to the circuit board 20. As shown in the figure, only bump electrodes (such as bump electrodes 5 and 10) in the shaded signal pin region 3 are connected to lines (such as lines 11 and 16) on the circuit board 20. The bump electrodes (such as bump electrodes 6, 7, 8, and 9) in the NC pin region 4 indicated by the dotted line are simply soldered to the circuit board 20.

It is therefore not necessary to provide lines to bump electrodes in an interior area of the semiconductor device 1 because signal pins are assigned only to the bump electrodes located in the peripheral area as shown in FIG. 2 and FIG. 3. It is therefore possible to use a single-layer circuit board 20 for mounting the semiconductor device 1, thereby simplifying circuit board design and lowering circuit board cost.

It should be noted that when the number of signal pins exceeds the number of bump electrodes in this peripheral area and bump electrodes inside of the outside-most row are also used for signal pins, the number of signal pin bump electrodes in the interior area is less than that when the signal pins are essentially randomly assigned to bump electrodes in the manner of the related art. As a result, the circuit board structure and design are still simplified, and circuit board cost can be reduced, compared with a conventional random arrangement as described above.

Figure 4:
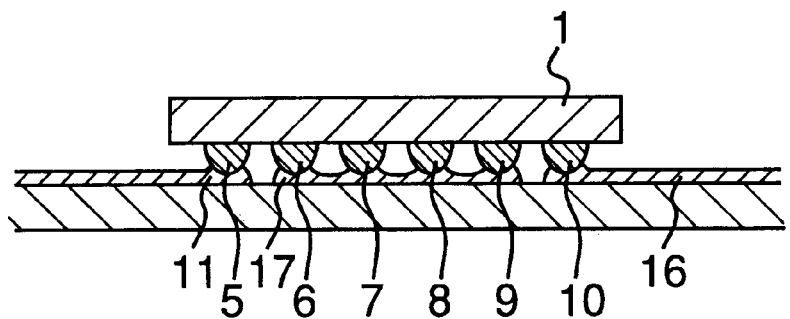
FIG. 4 is a typical side section view showing an alternative method of mounting a semiconductor device according to the first embodiment to a circuit board.

FIG. 4 is a side section view showing an alternative method of mounting the above semiconductor device 1 to a circuit board 20. In this version only NC pins are assigned to bump electrodes in the interior area of the semiconductor device 1. With this arrangement, it is possible to solder all NC pin bump electrodes (such as bump electrodes 6, 7, 8, and 9) to a single soldering pad 17, and thereby improve the mounting strength of the semiconductor device 1 to the circuit board 20.

Embodiment 2

Figure 5:
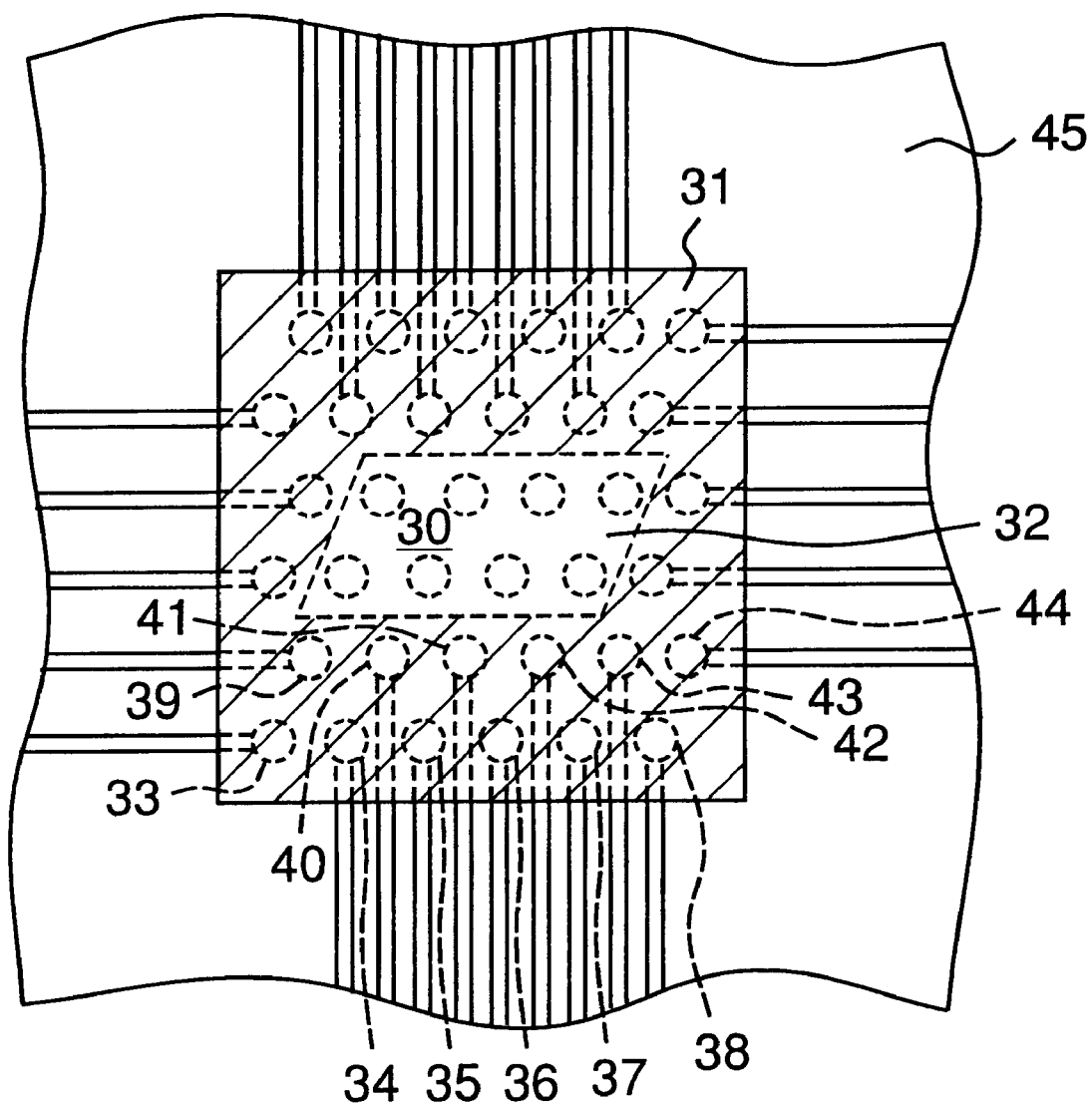
FIG. 5 is a typical top plan view of a semiconductor device according to a second embodiment of the present invention when mounted to a circuit board.

FIG. 5 is a top plan view of a semiconductor device 30 of a second version of the present invention when mounted to a circuit board 45. Note that the bump electrodes of this semiconductor device 30 are arranged in a staggered pattern with respect to the relative positions of, for example, bump electrodes 33 to 38 and bump electrodes 39 to 44, and all bump electrodes in the shaded signal pin region 31, that is, the bump electrodes in the outside row and the first row inside of the outside row, can be assigned to signal pins.

This arrangement makes it possible to connect more bump electrodes to a simple, straight line pattern on the circuit board than is possible with the semiconductor device 1 according to the first embodiment of the invention described above. As a result, the structure of the circuit board 45 can be simplified, and circuit board cost can be reduced.

It will also be obvious that the bump electrodes in the NC pin region 32 can be soldered to a single soldering pad as described above, thereby improving the mounting strength of the semiconductor device 30 to the circuit board 45.

Embodiment 3

Figure 6:
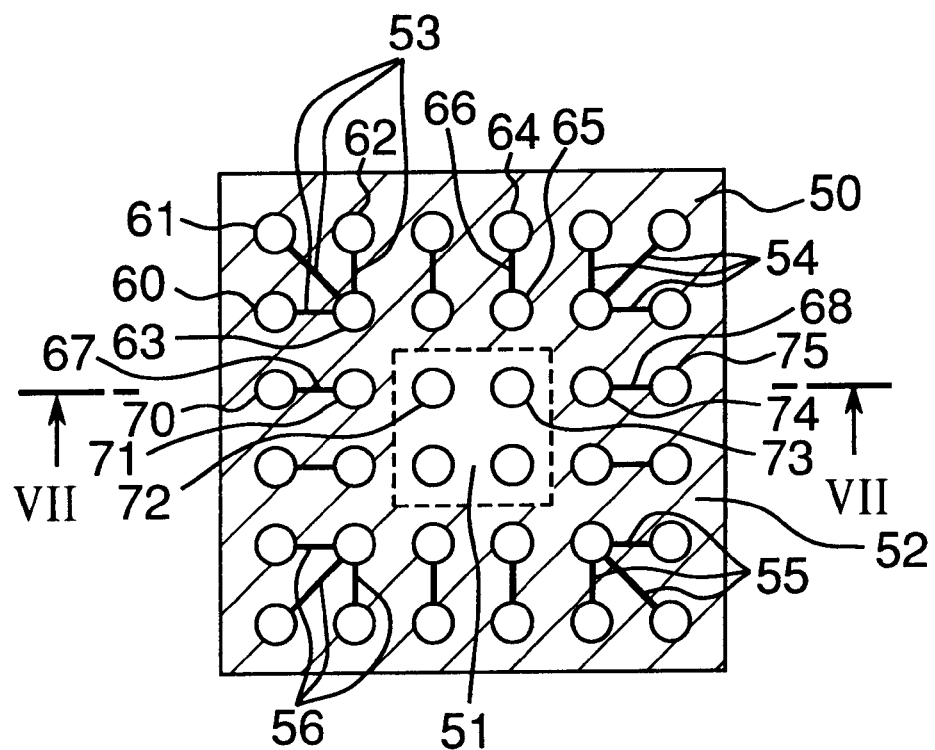
FIG. 6 is a typical top plan view of a semiconductor device according to a third embodiment of the present invention.

FIG. 6 is a plan view showing the bottom (that is, the side on which the bump electrodes are exposed) of a semiconductor device 50 according to a third version of the present invention. Note that for convenience of illustration, the bump electrode connection lines on the circuit board 80 (see FIG. 7) on which the semiconductor device 50 is mounted are also shown in FIG. 6 using bold lines.

A semiconductor device 50 according to the present embodiment differs from the above in that a single signal pin is assigned to a plurality of bump electrodes in the signal pin region 52, shown as the shaded area in FIG. 6. More specifically, a plurality of adjacent bump electrodes in the signal pin region 52 where at least one bump electrode is in the outside row and at least one is in the inside row adjacent thereto is connected to the same signal pin. These bump electrodes correspond to those shown connected by one or more bold lines in FIG. 6. The bump electrodes in the NC pin region 51, which is enclosed by a dotted line in FIG. 6, are connected to NC pins.

For example, the four bump electrodes 60, 61, 62, and 63 located in the upper left corner of the signal pin region 52 as seen in FIG. 6 are connected to the same signal pin. As a result, these four bump electrodes 60, 61, 62, and 63 are all connected to the same bump connection line 53 on the circuit board 80.

The groups of four bump electrodes in the remaining three corners of the semiconductor device 50 are likewise respectively connected to the same pins. As a result, said groups of four bump electrodes are also connected to the same bump connection lines 54, 55, and 56 on the circuit board 80.

Parallel bump electrodes such as bump electrodes 64 and 65, and 74 and 75, are also respectively connected to the same signal pins, and are, as a result, also connected to the same bump connection lines 66 and 67 on the circuit board 80.

Figure 7:
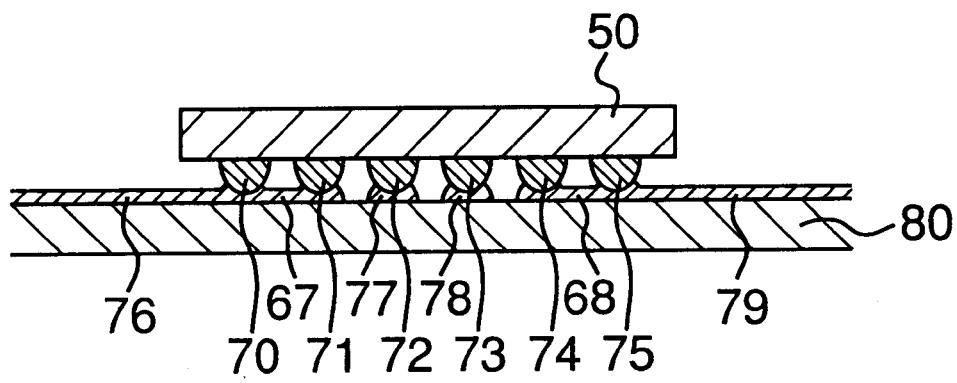
FIG. 7 is a typical side section view showing the semiconductor device shown in FIG. 6 when mounted to a circuit board.

FIG. 7 is a section view through line VII–VII' in FIG. 6 showing the semiconductor device 50 of the present embodiment mounted to a circuit board 80. Bump electrodes 70 and 71 assigned to the same signal pin are interconnected by bump connection line 67 and connected to line 76. Likewise, bump electrodes 74 and 75 assigned to the same signal pin are interconnected by bump connection line 68 and connected to line 79. In addition, bump electrodes 72 and 73 connected to an NC pin are connected to soldering pads 77 and 78.

By thus connecting a plurality of bump electrodes to one signal pin, an electrical connection between the line pattern and signal pin can be maintained by a remaining bump electrode when one of the plural bump electrodes assigned to the same signal pin becomes unsoldered as a result of expansion and contraction of the circuit board 80 due to environmental temperature change, or as a result of stress applied to the circuit board 80 during use. The reliability of connections between signal pin bump electrodes and the circuit board 80 can therefore also be improved.

It should be noted that the bump electrodes interconnected by means of bump connection lines (such as connection lines 53, 54, 55, 56, 66, 67, and 68) are preferably interconnected by means of discrete soldering pads instead of bump connection lines. This is an effective means of further improving the reliability of the connection between signal pin bump electrodes and the circuit board 80.

Furthermore, the bump electrodes (such as bump electrodes 72 and 73) in the NC pin region 51 can also be connected to a single soldering pad as in the previous embodiments, thereby improving the mounting strength of the semiconductor device 50 to the circuit board 80 as described above.

What is claimed is:

1. A semiconductor device for connection to a circuit board comprising:

a plurality of bump electrodes arranged in a first area and a second area, said second area extending around the periphery of said first area, wherein a signal pin for electrical connection to the circuit board is assigned to at least one of said plurality of bump electrodes located in said second area, and wherein a non-electrical connection pin configured for mechanical connection to the circuit board is assigned to at least one of said plurality of bump electrodes located in said first area.

2. The semiconductor device as claimed in claim 1, wherein bump electrodes to which signal pins are assigned are arranged in a staggered pattern.

3. The semiconductor device as claimed in claim 1, wherein a same signal pin is assigned to the neighboring members of the bump electrodes in the peripheral area.

4. A device comprising:

a semiconductor device mounted on a circuit board and including a plurality of bump electrodes arranged in a first area and a second area, said second area extending around the periphery of said first area;

a said circuit board including a signal pin and a non-electrical connection pin, said signal pin being assigned to at least one of said plurality of bump electrodes located in said second area, and a non-electrical connection pin being assigned and mechanically connected to at least one of said plurality of bump electrodes located in said first area; and a line to each of said bump electrodes to which said signal pin of the semiconductor device is assigned.

5. The circuit board as claimed in claim 4, wherein the bump electrodes to which signal pins are assigned are arranged in a staggered pattern.

6. The circuit board as claimed in claim 4, wherein the same signal pin is assigned to the neighboring members of the bump electrodes in the peripheral area of the semiconductor device, and wherein the circuit board comprises a bump electrode connection line for interconnecting the neighboring bump electrodes to which the same signal pin is assigned.

7. The circuit board as claimed in claim 4, further comprising a single connection member for connecting all of the bump electrodes to which the non electrical connection pin is assigned.

* * * * *